United States Patent
Chu et al.

(10) Patent No.: US 10,770,315 B2
(45) Date of Patent: Sep. 8, 2020

(54) FALL-PROOF APPARATUS FOR CLEANING SEMICONDUCTOR DEVICES AND A CHAMBER WITH THE APPARATUS

(71) Applicant: ACM Research (Shanghai) Inc., Shanghai (CN)

(72) Inventors: Zhenming Chu, Shanghai (CN); Xi Wang, Shanghai (CN); Hui Wang, Shanghai (CN); Shena Jia, Shanghai (CN); Jun Wu, Shanghai (CN); Fuping Chen, Shanghai (CN); Xuejun Li, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 325 days.

(21) Appl. No.: 15/550,971

(22) PCT Filed: Sep. 8, 2015

(86) PCT No.: PCT/CN2015/089096
§ 371 (c)(1),
(2) Date: Aug. 14, 2017

(87) PCT Pub. No.: WO2016/127635
PCT Pub. Date: Aug. 18, 2016

(65) Prior Publication Data
US 2018/0033654 A1    Feb. 1, 2018

(30) Foreign Application Priority Data
Feb. 15, 2015  (CN) .......................... 2015 1 0081989

(51) Int. Cl.
*H01L 21/00*  (2006.01)
*H01L 21/67*  (2006.01)
(Continued)

(52) U.S. Cl.
CPC .......... *H01L 21/67051* (2013.01); *B08B 3/02* (2013.01); *B08B 3/024* (2013.01);
(Continued)

(58) Field of Classification Search
CPC . H01L 21/67051; H01L 21/687; G08B 21/18; B08B 3/024; B08B 3/08; B08B 3/12; B08B 5/02; B08B 13/00
(Continued)

(56) References Cited

U.S. PATENT DOCUMENTS 4,064,885 A * 12/1977 Dussault ................... B08B 3/12
134/58 R
4,326,553 A * 4/1982 Hall .......................... B08B 3/12
134/153
(Continued)

FOREIGN PATENT DOCUMENTS

CN    101516534 A    8/2009
JP    2001-334221 A   12/2001
(Continued)

OTHER PUBLICATIONS

International Search Report issued in PCT/CN2015/089096 dated Dec. 14, 2015 (3 pages).
(Continued)

*Primary Examiner* — David G Cormier
*Assistant Examiner* — Thomas Bucci
(74) *Attorney, Agent, or Firm* — Osha Liang LLP

(57) ABSTRACT

A fall-proof apparatus for cleaning semiconductor devices is provided. The fall-proof apparatus comprises: a nozzle (102) connecting with a carrier (101); a megasonic/ultrasonic device (105) fixing on the carrier (101); and a sensor (104) detecting the distance between the megasonic/ultrasonic device (105) and the carrier (101) to determine whether the megasonic/ultrasonic device (105) is loose and going to fall.
(Continued)

The megasonic/ultrasonic device works with the nozzle during a cleaning process. A chamber with the fall-proof apparatus is also provided.

26 Claims, 12 Drawing Sheets

(51) Int. Cl.
| | |
|---|---|
| *B08B 13/00* | (2006.01) |
| *B08B 3/02* | (2006.01) |
| *B08B 9/00* | (2006.01) |
| *B08B 3/08* | (2006.01) |
| *B08B 3/12* | (2006.01) |
| *B08B 5/02* | (2006.01) |
| *G08B 21/18* | (2006.01) |
| *H01L 21/687* | (2006.01) |
| *G01B 5/14* | (2006.01) |
| *G01B 7/14* | (2006.01) |
| *G01B 11/14* | (2006.01) |

(52) U.S. Cl.
CPC ............... *B08B 3/08* (2013.01); *B08B 3/12* (2013.01); *B08B 5/02* (2013.01); *B08B 9/00* (2013.01); *B08B 13/00* (2013.01); *G08B 21/182* (2013.01); *H01L 21/687* (2013.01); *B08B 2203/0288* (2013.01); *G01B 5/14* (2013.01); *G01B 7/14* (2013.01); *G01B 11/14* (2013.01)

(58) Field of Classification Search
USPC ..... 134/104.1, 902, 184, 33, 34, 1.3, 1, 153, 134/137, 149, 157, 18, 198, 1.1, 201, 26, 134/32, 144, 147, 148, 151, 1.2
See application file for complete search history.

(56) References Cited

U.S. PATENT DOCUMENTS

| | | | | |
|---|---|---|---|---|
| 5,368,054 | A * | 11/1994 | Koretsky | B08B 3/12 134/153 |
| 5,745,946 | A * | 5/1998 | Thrasher | B08B 17/00 15/77 |
| 5,950,643 | A * | 9/1999 | Miyazaki | B28D 5/0076 134/25.4 |
| 5,980,647 | A * | 11/1999 | Buker | B08B 3/04 134/153 |
| 6,260,562 | B1 * | 7/2001 | Morinishi | H01L 21/67051 134/113 |
| 6,361,647 | B1 * | 3/2002 | Halley | B24B 37/042 156/345.1 |
| 6,385,805 | B2 * | 5/2002 | Konishi | B08B 1/04 134/902 |
| 6,539,952 | B2 * | 4/2003 | Itzkowitz | B08B 3/12 134/1 |
| 6,730,176 | B2 * | 5/2004 | Kuyel | B08B 3/02 134/1 |
| 6,848,455 | B1 * | 2/2005 | Shrinivasan | B08B 3/08 134/1.3 |
| 7,185,661 | B2 * | 3/2007 | Bran | B08B 3/12 134/1 |
| 8,011,378 | B2 * | 9/2011 | Lee | B08B 3/12 134/184 |
| 8,327,861 | B2 * | 12/2012 | Yin | B08B 3/12 134/105 |
| 8,520,184 | B2 * | 8/2013 | Shiraishi | G03B 27/42 355/30 |
| 9,044,794 | B2 * | 6/2015 | Holsteyns | B08B 3/12 |
| 2004/0200500 | A1 * | 10/2004 | Sakurai | H01L 21/67253 134/1.3 |
| 2007/0169800 | A1 * | 7/2007 | Fani | B08B 3/12 134/56 R |
| 2007/0175502 | A1 * | 8/2007 | Sliwa | B08B 3/123 134/184 |
| 2007/0190437 | A1 * | 8/2007 | Kaneyama | G03F 7/70925 430/30 |
| 2007/0232203 | A1 * | 10/2007 | Fukuda | B08B 1/04 451/287 |
| 2008/0023028 | A1 * | 1/2008 | Fujita | H01L 24/78 134/1.1 |
| 2008/0092918 | A1 * | 4/2008 | Ikuta | H01L 21/02054 134/1 |
| 2009/0277483 | A1 * | 11/2009 | Lee | H01L 21/67051 134/184 |
| 2010/0147336 | A1 * | 6/2010 | Obweger | H01L 21/67259 134/34 |
| 2011/0000504 | A1 * | 1/2011 | Brems | H01L 21/67051 134/1.3 |
| 2012/0097195 | A1 * | 4/2012 | Wang | H01L 21/02068 134/34 |
| 2012/0273458 | A1 * | 11/2012 | Bret | B82Y 10/00 216/39 |
| 2013/0152971 | A1 * | 6/2013 | Kato | H02L 21/68728 134/21 |
| 2015/0107620 | A1 * | 4/2015 | Wu | H01L 21/0209 134/6 |
| 2015/0303078 | A1 * | 10/2015 | Ishibashi | H01L 21/67028 134/18 |

FOREIGN PATENT DOCUMENTS

| | | |
|---|---|---|
| KR | 20100005571 A | 1/2010 |
| WO | 2010/111826 A1 | 10/2010 |

OTHER PUBLICATIONS

Written Opinion of the International Searching Authority issued in PCT/CN2015/089096 dated Dec. 14, 2015 (3 pages).

* cited by examiner

FALL-PROOF APPARATUS FOR CLEANING SEMICONDUCTOR DEVICES AND A CHAMBER WITH THE APPARATUS

FIELD OF THE INVENTION

The present invention generally relates to a fall-proof apparatus and a chamber with the fall-proof apparatus. More particularly, it relates to a fall-proof apparatus for cleaning semiconductor devices by applying megasonic/ultrasonic energy onto semiconductor devices.

BACKGROUND

With the development of science and technology, the semiconductor cleaning process is maturing day by day. Differing from the traditional mechanical cleaning process, a large number of advanced high-tech cleaning apparatuses and equipment begin to make their presence felt in the semiconductor manufacturing and processing market. As one of the best, the apparatuses and equipment having a megasonic/ultrasonic device are highly recommended.

The megasonic/ultrasonic device is a key unit for the advanced high-tech cleaning apparatus and equipment. The megasonic/ultrasonic device always works with a nozzle. During the cleaning process, under the high frequency vibration effect and the chemical reaction, the molecules of cleaning liquid driven by the megasonic/ultrasonic waves successively collide with the surface of the semiconductor device at a very high speed, by which the particles and tiny contaminants can be removed and resolved into the cleaning liquid.

As one of the key unit for the advanced high-tech cleaning apparatus and equipment, the megasonic/ultrasonic device could be large and heavy. Generally, the megasonic/ultrasonic device is fixed on a carrier, moving with the carrier inside the cleaning liquid. During the cleaning process, the megasonic/ultrasonic device is located above the semiconductor device, sending megasonic/ultrasonic waves towards the semiconductor device. Through a long period of usage, if the megasonic/ultrasonic device is not fixed firmly with the carrier, or the fixation between the megasonic/ultrasonic device and the carrier becomes loose, the megasonic/ultrasonic device will possibly fall off and break the semiconductor device below into pieces. Meanwhile, the megasonic/ultrasonic device keeps moving during the cleaning process, which increases the risk of the megasonic/ultrasonic device falling off. As is known to us, a semiconductor device costs thousands of dollars or even higher. So if this incident is not well controlled, it will become a great cost to the manufacturers and suppliers.

Moreover, after a long period of usage, particles and tiny contaminants may be generated on the megasonic/ultrasonic device or other units. So the megasonic/ultrasonic device need to be cleaned frequently in a chamber.

SUMMARY

According to an embodiment of the present invention, a fall-proof apparatus for cleaning semiconductor devices is provided. The fall-proof apparatus comprises: a nozzle connecting with a carrier; a megasonic device fixing on the carrier, the megasonic/ultrasonic device works with the nozzle during a cleaning process; a sensor detecting the distance between the megasonic/ultrasonic device and the carrier to determine whether the megasonic/ultrasonic device is loose and going to fall.

According to anther embodiment of the present invention, a chamber is provided. The chamber comprises: a fall-proof apparatus for cleaning semiconductor devices, the fall-proof apparatus comprises a nozzle connecting with a carrier, a megasonic/ultrasonic device fixing on the carrier, the megasonic/ultrasonic device works with nozzle during a cleaning process, a sensor detecting the distance between the megasonic/ultrasonic device and the carrier to determine whether the megasonic/ultrasonic device is loose and going to fall; a chuck for holding and rotating the semiconductor devices; a swing-spray head swinging back and forth above the semiconductor devices and spraying chemical liquid or gas to clean the semiconductor devices; and at least two trays for flushing or cleaning the swing-spray head or the megasonic/ultrasonic device.

BRIEF DESCRIPTION OF THE DRAWINGS

The present invention provides a fall-proof apparatus for cleaning semiconductor devices. Moreover, a chamber with the fall-proof apparatus is also provided in the present invention. Other objects and features will become apparent from the following detailed description taken in connection with the accompanying drawings. However, the drawings are provided for purpose of illustration only, and are not intended as a definition of the limits of the invention.

DETAILED DESCRIPTION

Preferred embodiments of this invention will be described in detail hereinafter with reference to the drawings. The embodiments of the present invention described are not limit the invention to the precise forms disclosed in the following detailed description.

Figure 1A:
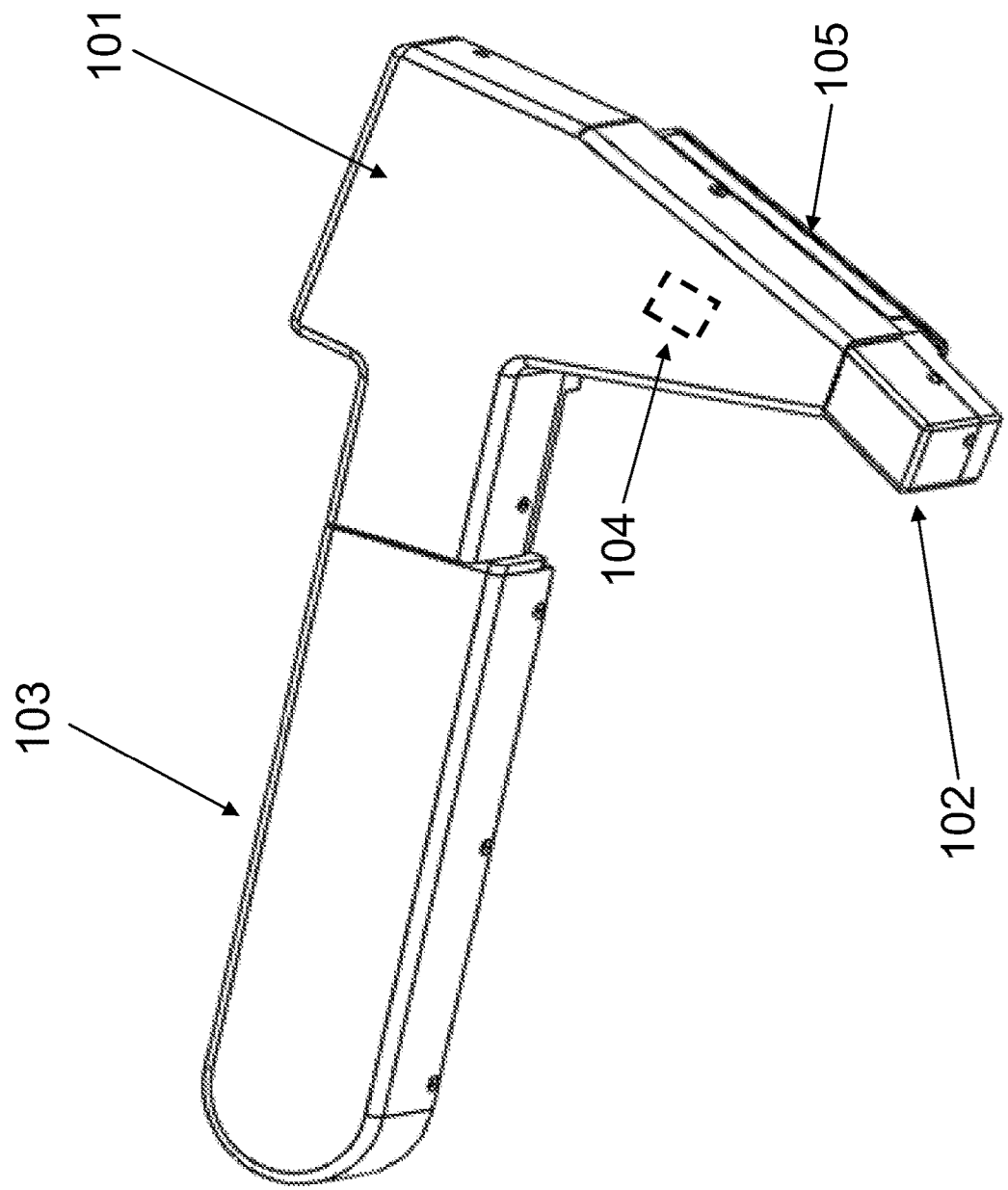
FIGS. 1a-1b illustrate one exemplary fall-proof apparatus for cleaning semiconductor devices.
Figure 1B:
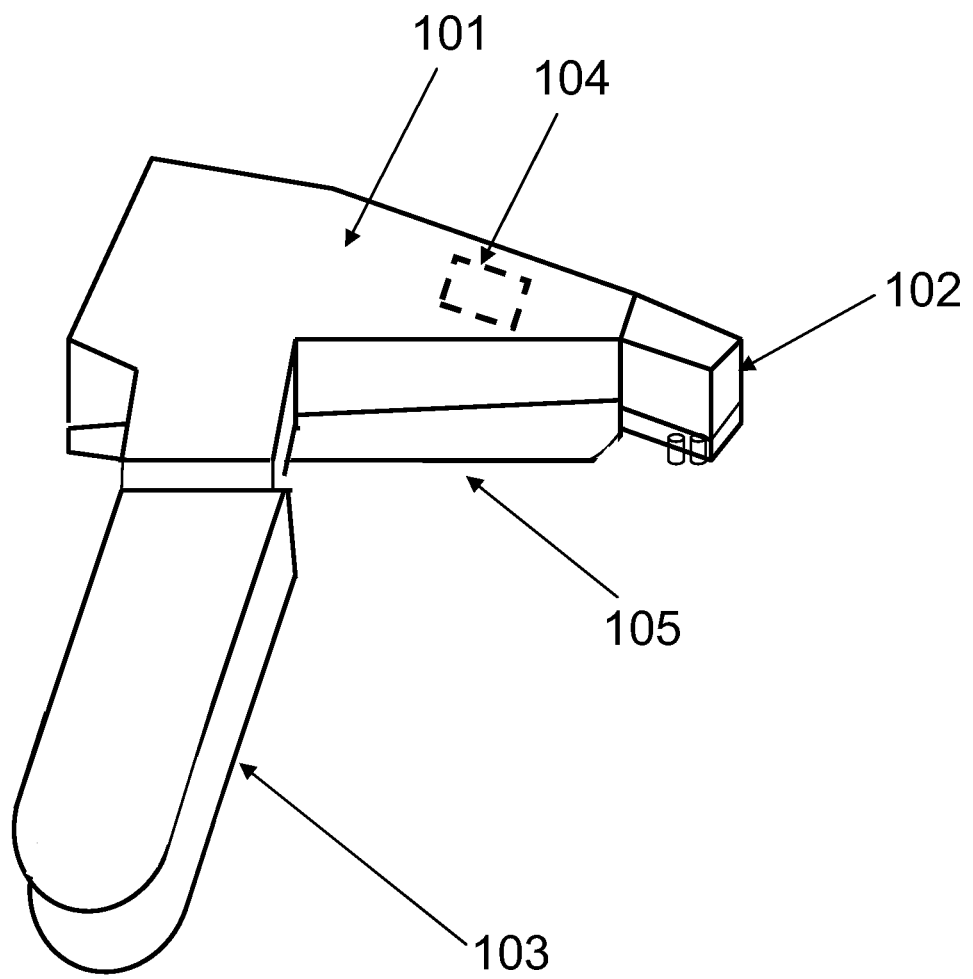

FIGS. 1a-1b illustrate one exemplary fall-proof apparatus for cleaning semiconductor devices. The fall-proof apparatus for cleaning semiconductor devices comprises a nozzle 102 connecting with a carrier 101; a megasonic/ultrasonic device 105 fixing on the carrier 101, the megasonic/ultrasonic device 105 working with the nozzle 102 during a cleaning process; a sensor 104 detecting the distance between the megasonic/ultrasonic device 105 and the carrier 101 to make a judgment on whether the megasonic/ultrasonic device 105 is loose and going to fall. Further more, the fall-proof apparatus comprises a swing arm 103 driving the fall-proof apparatus to move.

Figure 2A:
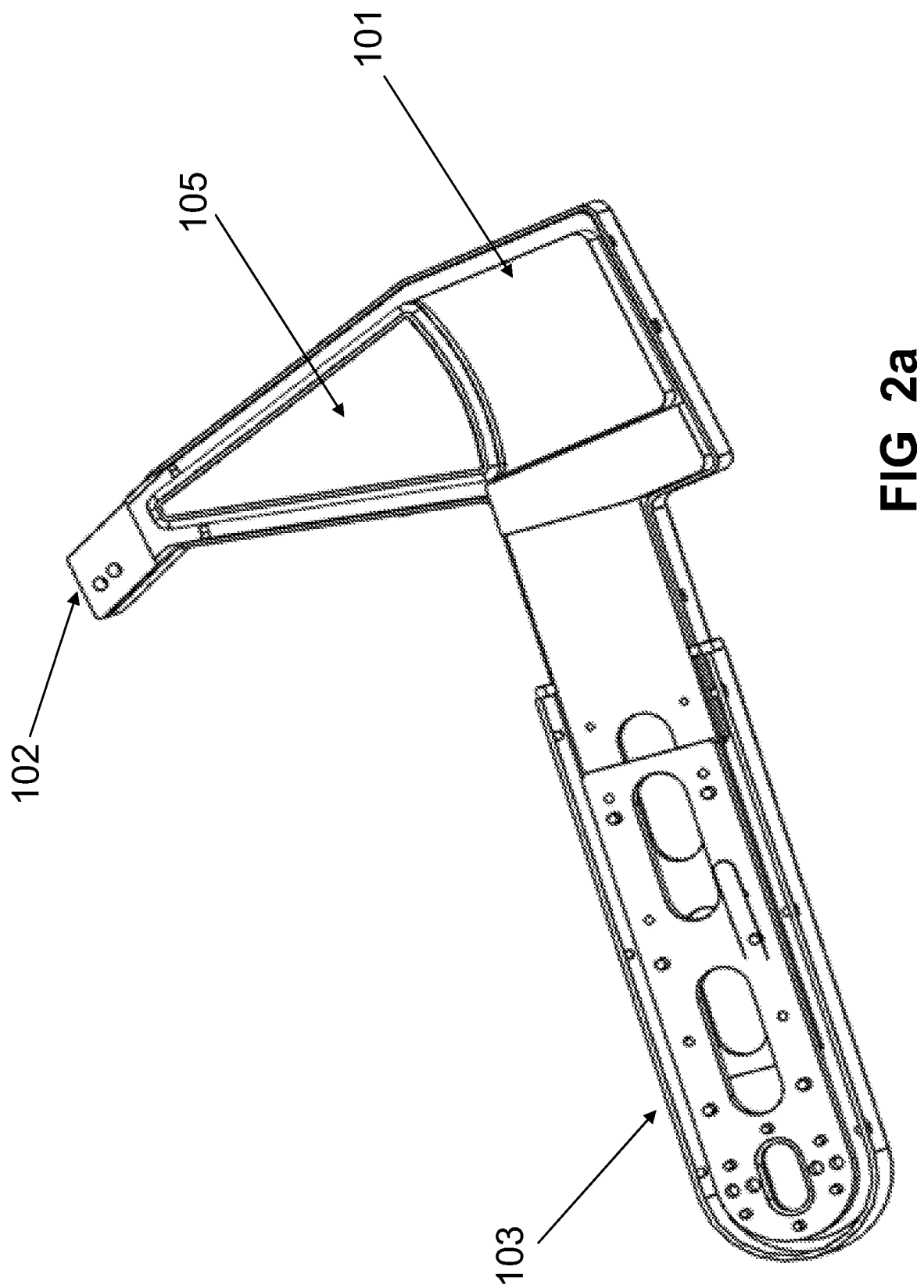
FIGS. 2a-2b illustrate a bottom section view of one exemplary fall-proof apparatus for cleaning semiconductor devices.
Figure 2B:
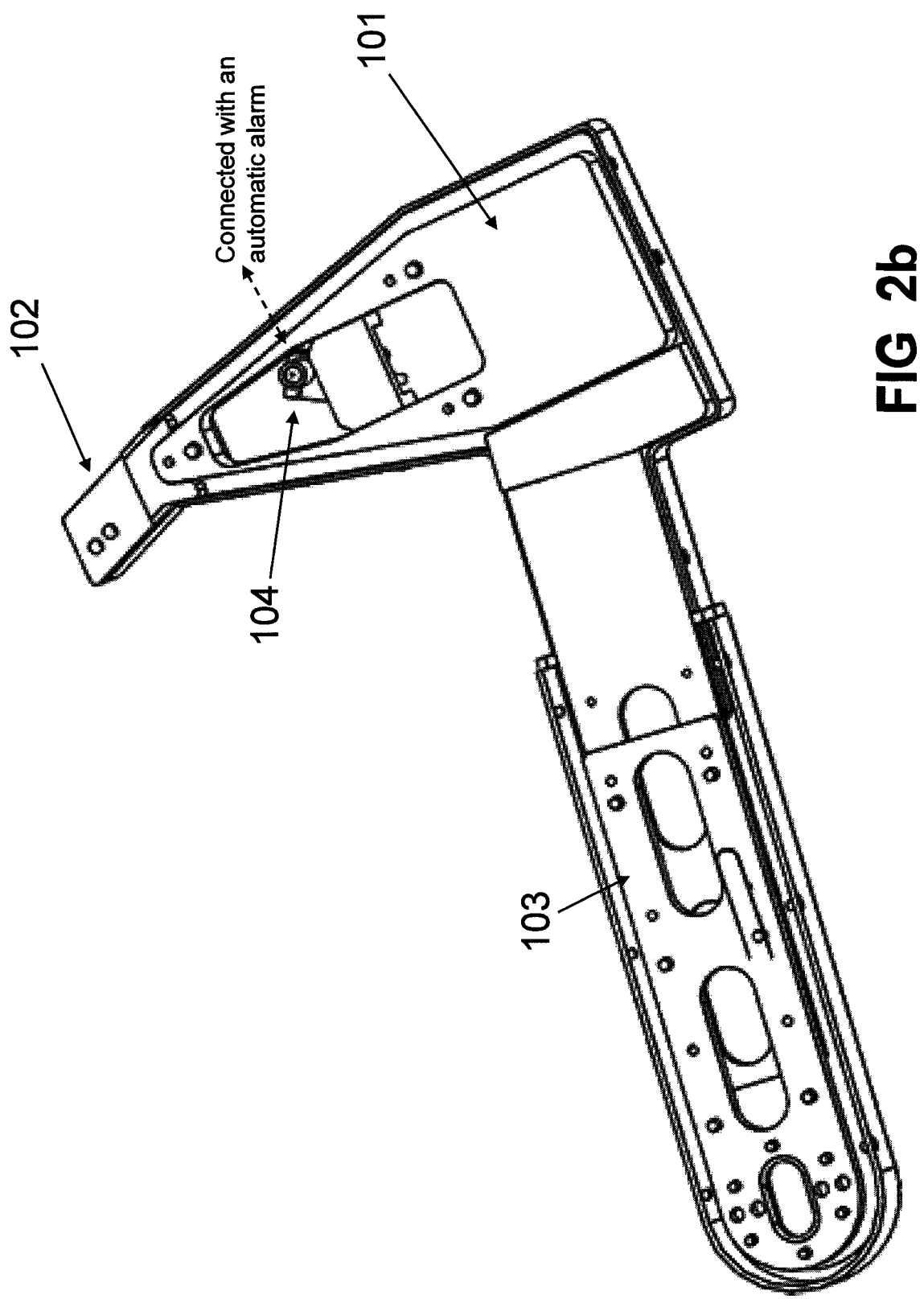

FIGS. 2a-2b illustrate a bottom section view of one exemplary fall-proof apparatus for cleaning semiconductor devices. Referring to FIG. 2a, it can be seen that the megasonic/ultrasonic device 105 is fan-shaped, so adaptable to a round semiconductor device. And referring to FIG. 2b, one exemplary fall-proof apparatus for cleaning semiconductor devices is shown, the megasonic/ultrasonic device 105 of this fall-proof apparatus is removed. So it can be seen that the sensor 104 is fixed on the carrier 101, and is placed between the megasonic/ultrasonic device and the carrier 101.

In one embodiment of the present invention, an output of the sensor, such as a sensor reading is in proportion to the distance between the megasonic/ultrasonic device 105 and the carrier 101. Further, if the distance between the megasonic/ultrasonic device 105 and the carrier 101 is a minimum, the output of the sensor, such as the sensor reading is "0". In one embodiment, the sensor 104 has an accuracy of 0.01 mm or a higher accuracy.

In one embodiment, the fall-proof apparatus further comprises an automatic alarm connecting with the sensor 104. The automatic alarm will be triggered if the sensor reading exceeds a preset threshold, which can remind the operating personnel to fix the megasonic/ultrasonic device 105. By this means, the megasonic/ultrasonic device 105 will have a lower chance of falling to break the semiconductor device below.

Figure 3:
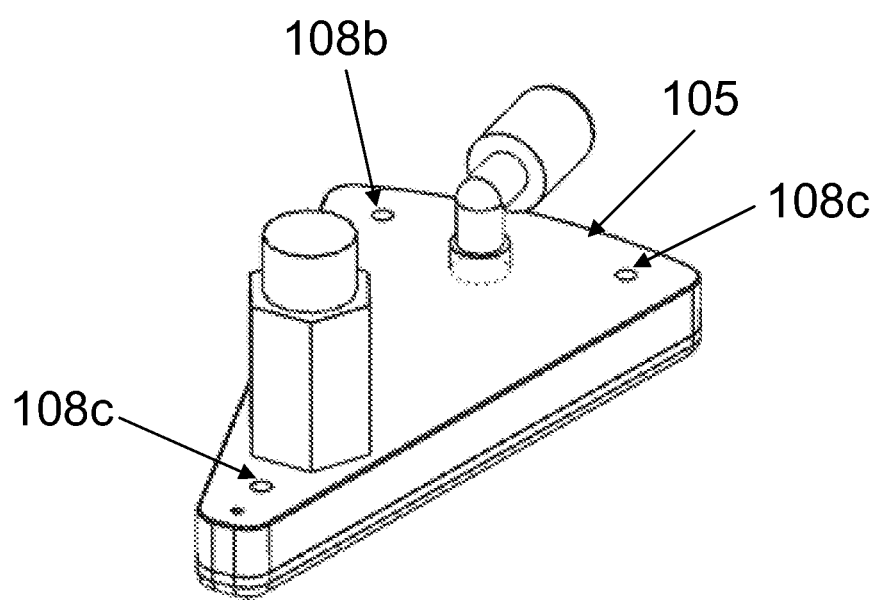
FIG. 3 illustrates one exemplary megasonic/ultrasonic device of the fall-proof apparatus for cleaning semiconductor devices.

FIG. 3 illustrates one exemplary megasonic/ultrasonic device of the fall-proof apparatus for cleaning semiconductor devices. In one embodiment, the megasonic/ultrasonic device 105 is fixed on the bottom side of the carrier 101 by at least one pair of screws and nuts which can adjust the distance between the megasonic/ultrasonic device 105 and the carrier 101. In one embodiment, there are three pairs of screws and nuts 108b and 108c distributed on the megasonic/ultrasonic device 105 in a triangular manner. The distance between the megasonic/ultrasonic device 105 and the carrier 101 can be adjusted by loosening or tightening at least one pair of the screws and nuts 108b and 108c. The sensor 104 is used to detect a position change of the megasonic/ultrasonic device 105 caused by loss of the screws and nuts 108b and 108c. Loss of a part of all of the three pairs of screws and nuts may cause a position change of the megasonic/ultrasonic device 105. The sensor 104 detects a distance between the megasonic/ultrasonic device 105 and the carrier 101, the distance is represented by the output of the sensor 104 and is used as a reference for adjusting the screws and nuts. That is, at least one pair of the screws and nuts are loosed or tightened according to the output of the sensor. Further, in the cleaning process, cleaning liquid flows out from the nozzle 102 to the semiconductor device, the megasonic/ultrasonic device 105 is immerged into the cleaning liquid and used for generating megasonic/ultrasonic waves.

Figure 4:
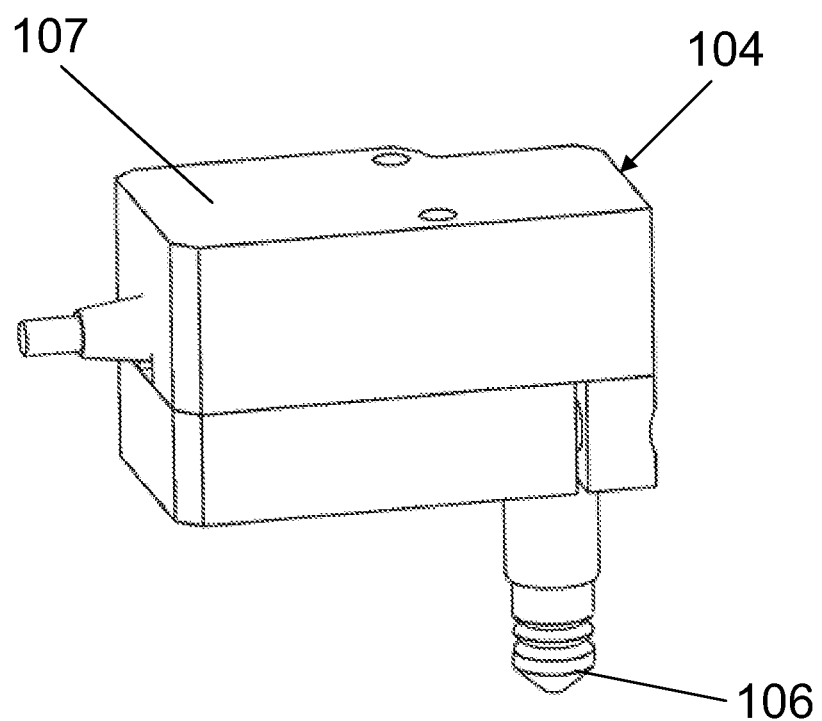
FIG. 4 illustrates one exemplary sensor of the fall-proof apparatus for cleaning semiconductor devices.

FIG. 4 illustrates one exemplary sensor of the fall-proof apparatus for cleaning semiconductor devices. Referring to FIG. 4, in one embodiment, the sensor 104 is a pressure sensor comprising a measuring end 106 and a fixing end 107, the fixing end 107 is fixed on the carrier 101, the measuring end 106 is retractable and pressed tightly by the megasonic/ultrasonic device 105. The pressure sensor detects the expansion amount of the measuring end 106 to make a judgment on whether the megasonic/ultrasonic device 105 becoming loose and fall.

In another embodiment, the sensor 104 is a light sensor. The light sensor emits light signal toward the megasonic/ultrasonic device 105 and receives the reflected light signal to calculate the time taken for this round-trip of light signal. By this means, the distance between the carrier 101 and the megasonic/ultrasonic device 105 can be detected.

In one embodiment, the sensor 104 is an electric sensor. The electric sensor can detect the distance between the carrier 101 and the megasonic/ultrasonic device 105 by monitoring the variation of electrical parameters.

Referring to FIG. 5a-FIG. 9, a chamber of the present invention is provided.

Figure 5A:
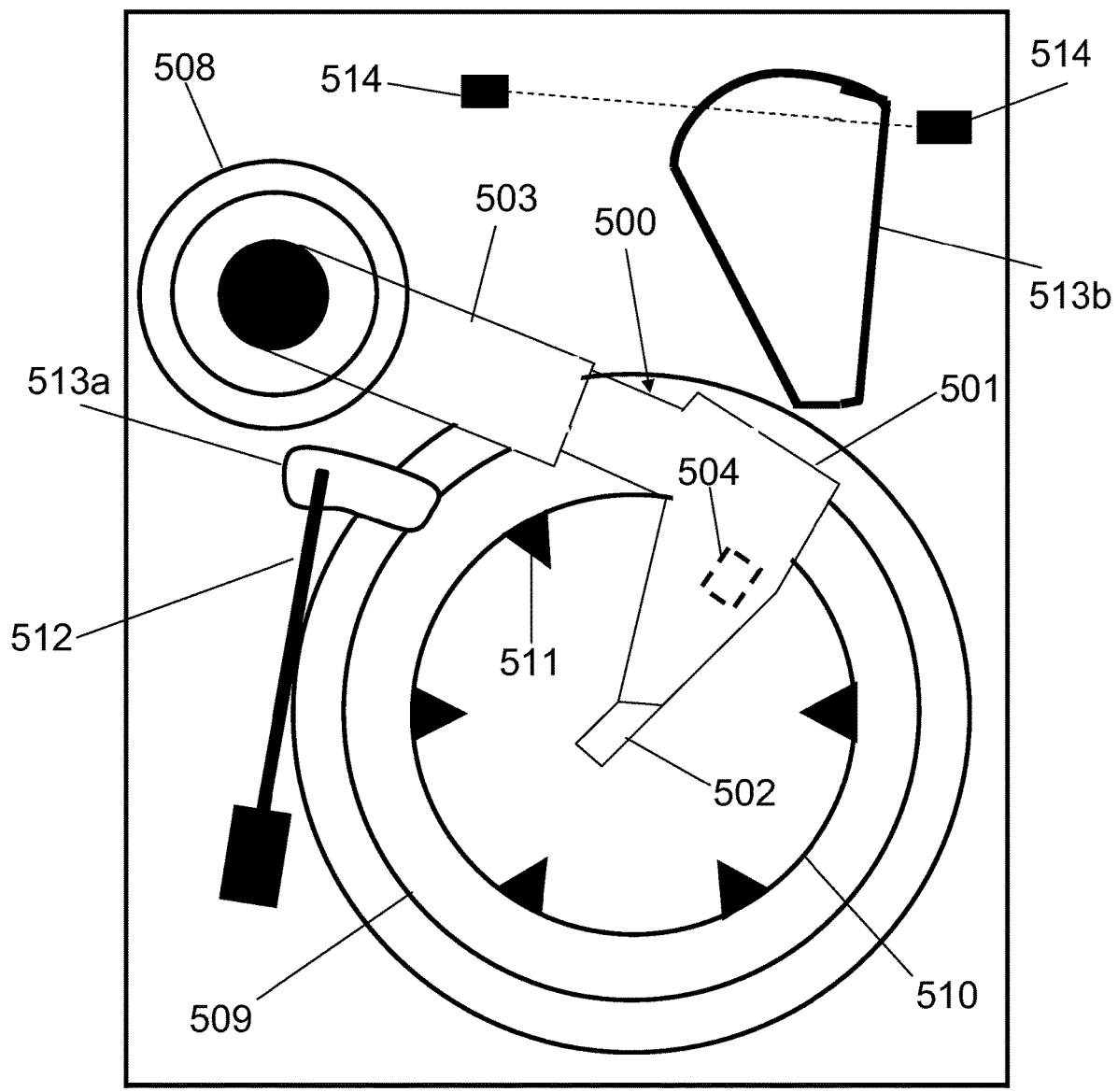
FIGS. 5a-5b illustrate one exemplary chamber of the present invention.
Figure 5B:
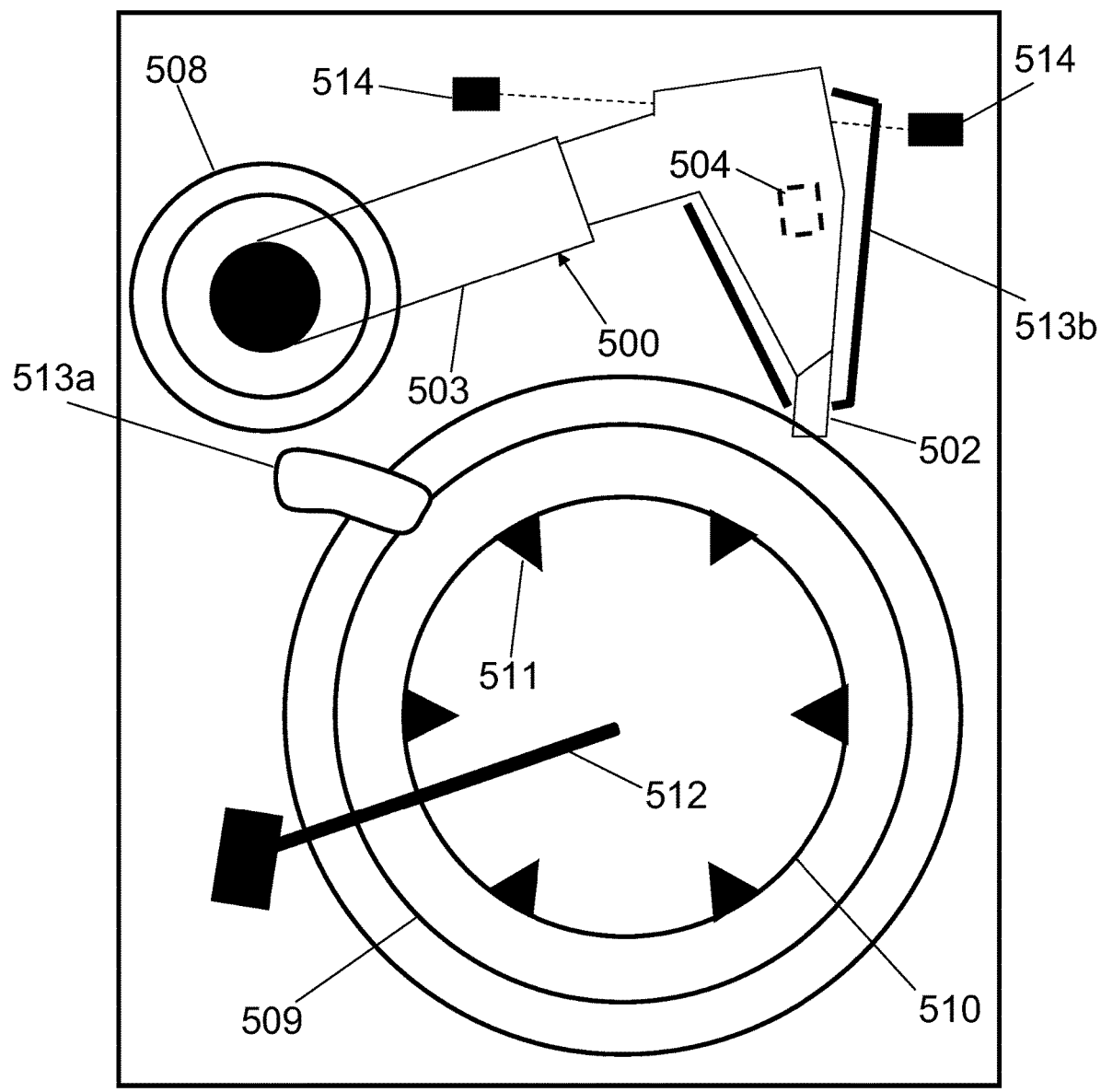

FIGS. 5a-5b illustrate one exemplary chamber of the present invention.

According to FIGS. 5a-5b, the chamber comprises a fall-proof apparatus 500 for cleaning semiconductor devices, the fall-proof apparatus 500 comprises a nozzle 502 connecting with a carrier 501, a megasonic/ultrasonic device 505 fixing on the carrier 501, the megasonic/ultrasonic device 505 working with the nozzle 502 during a cleaning process, a sensor 504 detecting the distance between the megasonic/ultrasonic device 505 and the carrier 501 to make a judgment on whether the megasonic/ultrasonic device 505 becoming loose and fall; a chuck 509 for holding and rotating the semiconductor devices 510; a swing-spray head 512 swinging back and forth above the semiconductor devices 510 and spraying chemical liquid or gas to clean the semiconductor devices 510; and at least two trays 513 for flushing or cleaning the swing-spray head 512 or the megasonic/ultrasonic device 505. The fall-proof apparatus 500 further comprises a swing arm 503 and a vertical actuator 508. The swing arm 503 driving the fall-proof apparatus 500 to move. And the vertical actuator 508 driving the fall-proof apparatus 500 to move up and down. The chuck 509 driving the semiconductor device 510 to rotate during the cleaning process. And some clamping elements 511 are distributed on the chuck 509 and around the semiconductor device 510 for preventing the semiconductor device 510 from moving.

During the cleaning process, the swing-spray head 512 swinging back and forth within a working position which is above the semiconductor device 510, to spray chemical liquids onto the semiconductor device 510 first. After then, the swing-spray head 512 is driven to the idle position, while the megasonic/ultrasonic device 505 is driven to the working position. The nozzle 502 keeps on spraying chemical liquids onto the semiconductor device 510 at the working position, and the the megasonic/ultrasonic device 505 is driven down by the vertical actuator 508 and immerged into the chemical liquids to generate megasonic/ultrasonic waves for cleaning the semiconductor device 505. The megasonic/ultrasonic waves propagate and vibrate in the chemical liquids, Meanwhile, the chuck 509 driving the semiconductor device 510 to rotate during the cleaning process. By this means, the semiconductor device 510 can be cleaned in the cleaning process.

As is known to the skilled in this art, after a long period of usage, particles and tiny contaminants may be generated on the megasonic/ultrasonic device 505 and the nozzle 502. So the megasonic/ultrasonic device 505 and the nozzle 502 need to be cleaned frequently in a chamber during their idle time. Therefore, at least two trays 513 for flushing or cleaning the swing-spray head 512 or the megasonic/ultrasonic device 505 are provided in the chamber.

Referring to FIG. 5a, it can be seen that the megasonic/ultrasonic device 505 is working, while the swing-spray head 512 is staying at the second idle position, keeping the swing-spray head 512 above the tray 513a.

Referring to FIG. 5b, it can be seen that the swing-spray head 512 is working, while the swing arm 503 is staying at a first idle position, keeping the megasonic/ultrasonic device 505 above the tray 513b.

Figure 6:
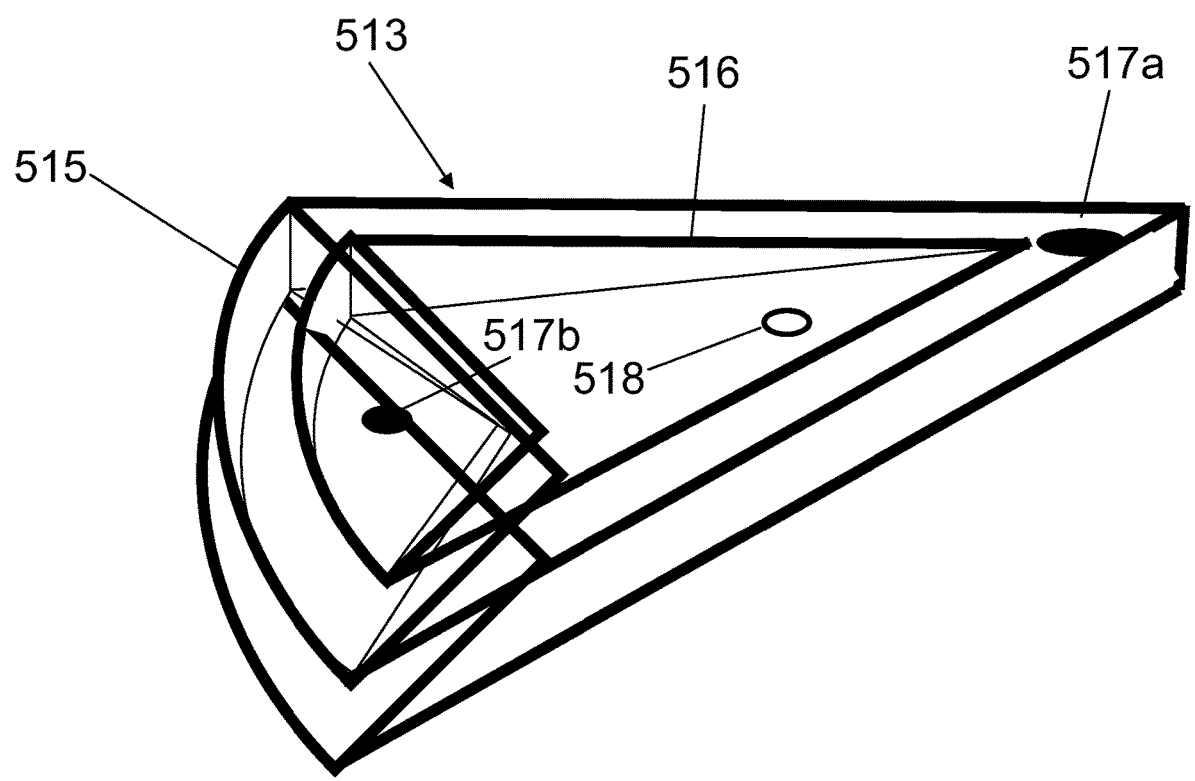
FIG. 6 illustrates one exemplary tray of the chamber.

The shapes of the at least two trays 513, tray 513a and tray 513b, can be different from each other to match the swing-spray head 512 and the megasonic/ultrasonic device 505. Referring to FIG. 6, an exemplary tray 513 of the present chamber is given. The tray 513 comprises an inner tray 516 and an outer tray 515, the inner tray 516 is arranged inside the outer tray 515 and has a lower sidewall than the outer tray 515. Both the inner tray 516 and the outer tray 515 have a drain outlet 517b and 517a respectively. Further, the tray 513 has an ejection head 518 for flushing or cleaning the swing-spray head 512 or the megasonic/ultrasonic device 505 by liquid ejection.

In some cases, the swing-spray head 512 and the megasonic/ultrasonic device 505 need to be flushed before starting the cleaning process. Because the chemical liquids sprayed from the swing-spray head 512 and the nozzle 502 may not meet the process requirement at the beginning of the cleaning process. Some technical parameters, such as temperature, flow rate, etc, are not very stable, so it is necessary to flush the swing-spray head 512 and the megasonic/ultrasonic device 505 before starting the cleaning process.

For flushing the swing-spray head 512 and the megasonic/ultrasonic device 505, the swing-spray head 512 or the megasonic/ultrasonic device 505 is driven to the top of one tray 513, spraying chemical liquids into the tray 513 for a period of time. Further, the nozzle 502 and the swing-spray head 512 are connected to a monitoring system to detect the relative technical parameters. The swing-spray head 512 and the megasonic/ultrasonic device 505 will be driven back to the working position until the chemical liquids meet the process requirement. In some cases, if the swing arm 503 is bending, the distance between the megasonic/ultrasonic device 505 and the semiconductor device 510 will be too close during the cleaning process, which may break the semiconductor devices 510. So at least a pair of transducers 514 are horizontally disposed on both sides of the tray 513b to detect whether the swing arm 503 is bending by sending and receiving light signals. In one embodiment, the transducers 514 are laser transducers. After the swing arm 503 gets back to the idle position, if the at least a pair of transducers 514 can not receive the light signals, which means the swing arm 503 is bending and need to be replaced or repaired. Otherwise, if the at least a pair of transducers 514 can receive the light signals as normal, which means the swing arm 503 is horizontal.

For cleaning the swing-spray head 512 and the megasonic/ultrasonic device 505, the swing-spray head 512 or the megasonic/ultrasonic device 505 is also driven to the top of one tray 513 during idle time. The ejection head 518 sprays cleaning liquid toward the swing-spray head 512 or the megasonic/ultrasonic device 505 for cleaning the swing-spray head 512 or the megasonic/ultrasonic device 505. And the megasonic/ultrasonic device 505 driven by the vertical actuator 508 moves down and immerges into the cleaning liquid. So the particles and contaminants will be removed by this liquid ejection. In one embodiment, the cleaning liquid is DIW. Referring to FIG. 6, it can be seen that the ejection head 518 is in the inner tray 516, and the inner tray 516 has a lower sidewall than the outer tray 515. So if the inner tray 516 is filled up with cleaning liquid, the excess cleaning liquid will spill out into the outer tray 515. By this means, the cleaning liquid in the inner tray 516 is kept clean and running, which is conductive to cleaning the swing-spray head 512 or the megasonic/ultrasonic device 505. Further, both the inner tray 516 and the outer tray 515 have a drain outlet 517b and 517a for draining out the cleaning liquid respectively.

Figure 7:
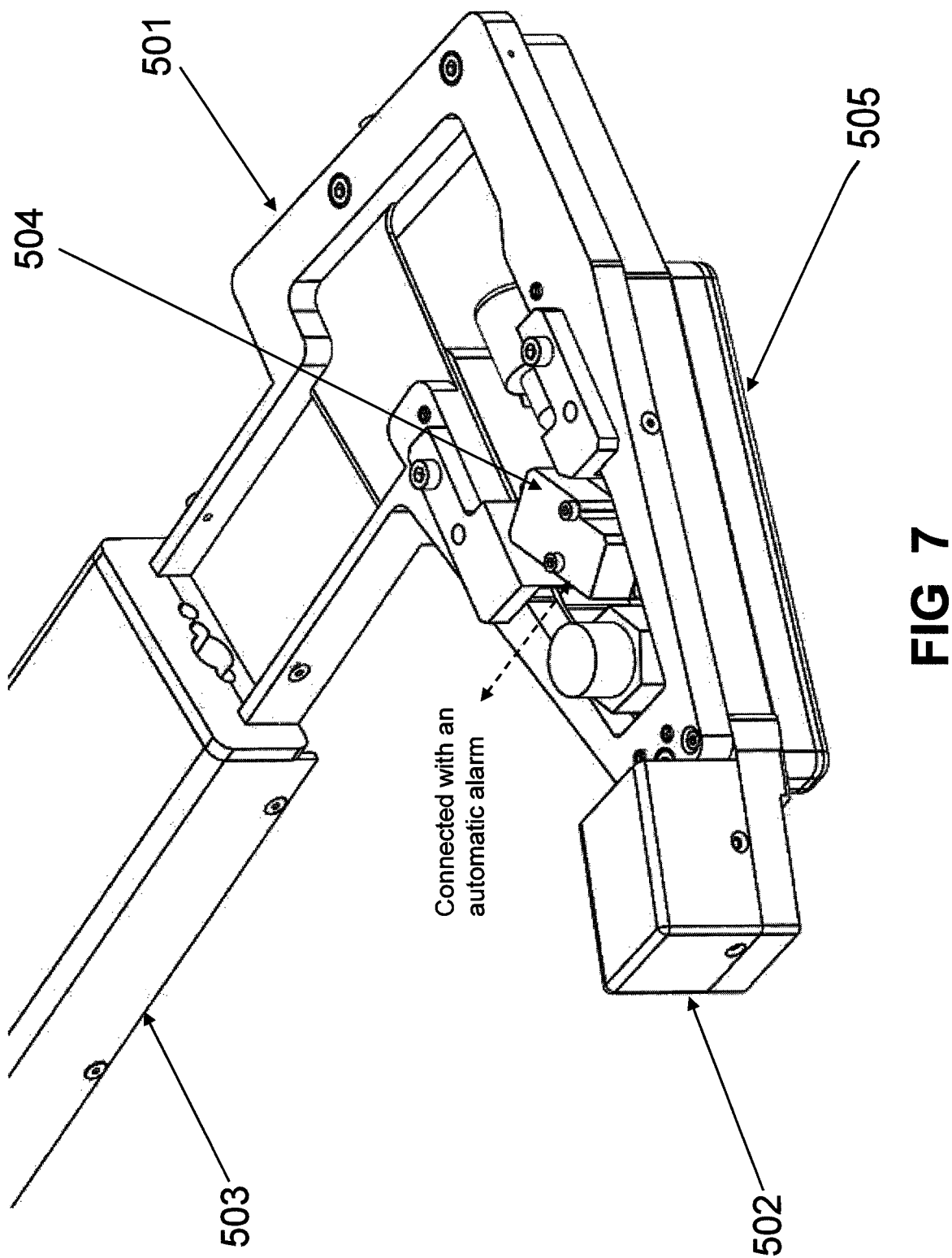
FIG. 7 illustrates one exemplary fall-proof apparatus for cleaning semiconductor devices of the chamber.

FIG. 7 illustrates one exemplary fall-proof apparatus for cleaning semiconductor devices of the chamber. The fall-proof apparatus for cleaning semiconductor devices comprises a nozzle 502 connecting with a carrier 501; a megasonic/ultrasonic device 505 fixing on the carrier 501, the megasonic/ultrasonic device 505 working with the nozzle 502 during a cleaning process; a sensor 504 detecting the distance between the megasonic/ultrasonic device 505 and the carrier 501 to make a judgment on whether the megasonic/ultrasonic device 505 becoming loose and fall. Further more, the fall-proof apparatus comprises a swing arm 503 driving the fall-proof apparatus to move. In one embodiment, the megasonic/ultrasonic device 505 is fan-shaped, so adaptable to a round semiconductor device 510. The sensor 504 is fixed on the carrier 501, and is placed between the megasonic/ultrasonic device and the carrier 501.

In one embodiment of the present invention, an output of the sensor, such as a sensor reading is in proportion to the distance between the megasonic/ultrasonic device 505 and the carrier 501. Further, if the distance between the megasonic/ultrasonic device 505 and the carrier 501 is a minimum, the output of the sensor, such as the sensor reading is "0". In one embodiment, the sensor 504 has an accuracy of 0.01 mm or a higher accuracy.

In one embodiment, the fall-proof apparatus further comprises an automatic alarm connecting with the sensor 504. The automatic alarm will be triggered if the output of the sensor, such as the sensor reading exceeds a preset threshold, which can remind the operating personnel to fix the megasonic/ultrasonic device 505. By this means, the megasonic/ultrasonic device 505 will have a lower chance of falling to break the semiconductor device 510 below.

Figure 8:
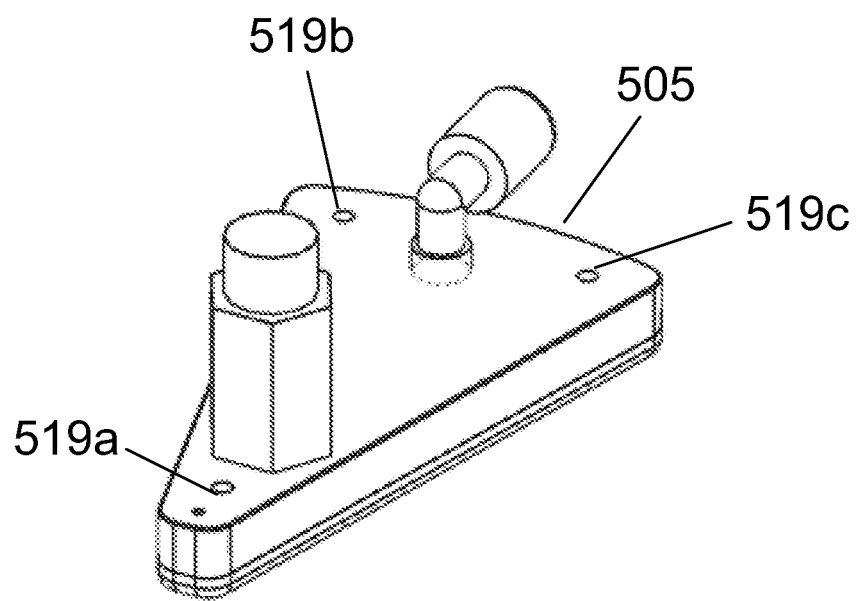
FIG. 8 illustrates one exemplary megasonic/ultrasonic device of the chamber.

FIG. 8 illustrates one exemplary megasonic/ultrasonic device of the chamber. In one embodiment, the megasonic/ultrasonic device 505 is fixed on the bottom side of the carrier 501 by at least a pair of screws and nuts which can adjust the distance between the megasonic/ultrasonic device and the carrier. In one embodiment, there are three pairs of screws and nuts 519a, 519b, and 519c distributed on the megasonic/ultrasonic device 505 in a triangular manner. The distance between the megasonic/ultrasonic device 505 and the carrier 501 can be adjusted by loosening or tightening at least one pair of the screws and nuts 519a, 519b, and 519c. The sensor 104 is used to detect a position change of the megasonic/ultrasonic device 105 caused by loss of the screws and nuts 519a, 519b, and 519c. Loss of a part of all of the three pairs of screws and nuts may cause a position change of the megasonic/ultrasonic device 505. The sensor 504 detects a distance between the megasonic/ultrasonic device 505 and the carrier 501, the distance is represented by the output of the sensor 504 and is used as a reference for adjusting the screws and nuts. That is, at least one pair of the screws and nuts are loosed or tightened according to the output of the sensor. Further, in the cleaning process, cleaning liquid flows out from the nozzle 502 to the semiconductor device, the megasonic/ultrasonic device 505 is immerged into the cleaning liquid and used for generating megasonic/ultrasonic waves.

Figure 9:
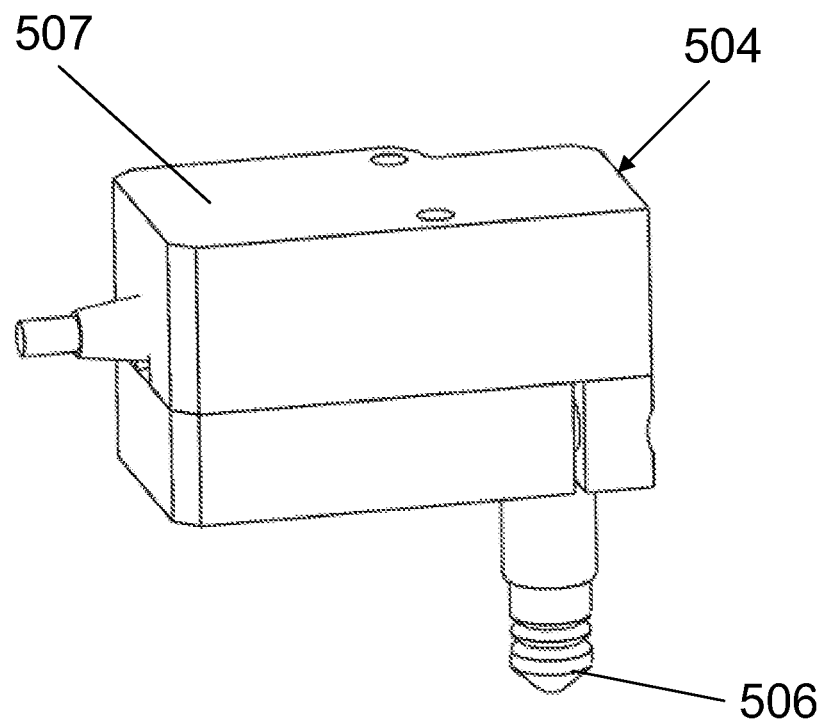
FIG. 9 illustrates one exemplary sensor of the chamber.

FIG. 9 illustrates one exemplary sensor of the chamber. Referring to FIG. 9, in one embodiment, the sensor 504 is a pressure sensor comprising a measuring end 506 and a fixing end 507, the fixing end 507 is fixed on the carrier 501, the measuring end 506 is retractable and pressed tightly by the megasonic/ultrasonic device 505. The pressure sensor detects the expansion amount of the measuring end 506 to make a judgment on whether the megasonic/ultrasonic device 505 becoming loose and fall.

In another embodiment, the sensor 504 is a light sensor. The light sensor emits light signal toward the megasonic/ ultrasonic device 505 and receives the reflected light signal to calculate the time taken for this round-trip of light signal. By this means, the distance between the carrier 501 and the megasonic/ultrasonic device 505 can be detected.

In one embodiment, the sensor 504 is an electric sensor. The electric sensor can detect the distance between the carrier 501 and the megasonic/ultrasonic device 505 by monitoring the variation of electrical parameters.

Although the present invention has been described with respect to certain embodiments, examples, and applications, it will be apparent to those skilled in the art that various modifications and changes may be made without departing from the invention.

What is claimed is:

1. A fall-proof apparatus for cleaning semiconductor devices, comprising:
   a nozzle connecting with a carrier;
   a megasonic/ultrasonic wave generator that is fan-shaped, is fixed to the carrier, and generates megasonic/ultrasonic waves to clean the semiconductor devices;
   a sensor that detects the distance between the megasonic/ultrasonic wave generator and the carrier and determines, based on the distance, whether the megasonic/ultrasonic wave generator is loose and going to fall,
   wherein, during a cleaning process, the megasonic/ultrasonic wave generator is immerged into chemical liquids sprayed by the nozzle and generates megasonic/ultrasonic waves to clean the semiconductor devices.

2. The fall-proof apparatus of claim 1, wherein the megasonic/ultrasonic wave generator is fixed on the carrier by at least one pair of screws and nuts, and the distance between the megasonic/ultrasonic wave generator and the carrier is adjusted by loosening or tightening the at least one pair of the screws and nuts.

3. The fall-proof apparatus of claim 1, wherein the sensor is one of the following:
   a pressure sensor, a light sensor or an electric sensor.

4. The fall-proof apparatus of claim 1, wherein an output of the sensor is in proportion to the distance between the megasonic/ultrasonic wave generator and the carrier.

5. The fall-proof apparatus of claim 4, wherein the output of the sensor is a sensor reading and the sensor reads "0" to represent a smallest distance between the megasonic/ultrasonic wave generator and the carrier.

6. The fall-proof apparatus of claim 1, wherein the sensor has an accuracy of 0.01 mm or a higher accuracy.

7. The fall-proof apparatus of claim 1, wherein the fall-proof apparatus further comprising an automatic alarm connecting with the sensor.

8. The fall-proof apparatus of claim 7, wherein the automatic alarm is triggered if an output of the sensor exceeds a preset threshold.

9. The fall-proof apparatus of claim 1, wherein the fall-proof apparatus further comprising a swing arm driving the fall-proof apparatus to move.

10. A chamber, comprising:
    a fall-proof apparatus for cleaning semiconductor devices, the fall-proof apparatus comprising
        a nozzle, connecting with a carrier, that sprays chemical liquids to clean the semiconductor devices,
        a megasonic/ultrasonic wave generator that is fan-shaped, is fixed to the carrier, and generates megasonic/ultrasonic waves to clean the semiconductor devices, and
        a sensor that detects the distance between the megasonic/ultrasonic wave generator and the carrier and determines, based on the distance, whether the megasonic/ultrasonic wave generator is loose and going to fall;
    a chuck for holding and rotating the semiconductor devices;
    a swing-spray head swinging back and forth above the semiconductor devices and the chemical liquids or gas to clean the semiconductor devices; and
    at least two trays for flushing or cleaning the swing-spray head or the megasonic/ultrasonic wave generator,
    wherein, during a cleaning process, the megasonic/ultrasonic wave generator is immerged into the chemical liquids and generates the megasonic/ultrasonic waves to clean the semiconductor devices.

11. The chamber of claim 10, wherein the megasonic/ultrasonic wave generator is fixed on the carrier by at least one pair of screws and nuts, and the distance between the megasonic/ultrasonic wave generator and the carrier is adjusted by loosening or tightening the at least one pair of the screws and nuts.

12. The chamber of claim 10, wherein the sensor is one of the following:
    a pressure sensor, a light sensor or an electric sensor.

13. The chamber of claim 10, wherein an output of the sensor is in proportion to the distance between the megasonic/ultrasonic wave generator and the carrier.

14. The chamber of claim 13, wherein the output of the sensor is a sensor reading and the sensor reads "0" to represent a smallest distance between the megasonic/ultrasonic wave generator and the carrier.

15. The chamber of claim 10, wherein the fall-proof apparatus further comprising a swing arm driving the fall-proof apparatus to move.

16. The chamber of claim 15, wherein the swing arm staying at a first idle position during idle time, keeping the megasonic/ultrasonic wave generator above one of the at least two trays.

17. The chamber of claim 10, wherein the swing-spray head staying at a second idle position during idle time, keeping the swing-spray head above one of the at least two trays.

18. The chamber of claim 10, wherein each of the at least two trays comprising an inner tray and an outer tray, the inner tray is arranged inside the outer tray and has a lower sidewall than the outer tray.

19. The chamber of claim 18, wherein both the inner tray and the outer tray having a drain outlet respectively.

20. The chamber of claim 10, wherein each of the at least two trays having an ejection head for flushing or cleaning the swing-spray head or the megasonic/ultrasonic wave generator by liquid ejection.

21. The chamber of claim 10, wherein the fall-proof apparatus further comprising a vertical actuator driving the fall-proof apparatus to move up and down.

22. The chamber of claim 10, wherein the sensor has an accuracy of 0.01 mm or a higher accuracy.

23. The chamber of claim 10, wherein the fall-proof apparatus further comprising an automatic alarm connecting with the sensor.

24. The chamber of claim 23, wherein the automatic alarm is triggered if an output of the sensor exceeds a preset threshold.

25. The chamber of claim 10, wherein the nozzle and the spring-spray head are connected to a monitor to detect technical parameters.

26. The chamber of claim 14, wherein the chamber further comprising at least a pair of transducers to detect whether the swing arm is bending.

\* \* \* \* \*